(12) United States Patent
Hashigami et al.

(10) Patent No.: US 11,631,779 B2
(45) Date of Patent: Apr. 18, 2023

(54) SOLAR CELL WITH HIGH PHOTOELECTRIC CONVERSION EFFICIENCY AND METHOD FOR MANUFACTURING SOLAR CELL WITH HIGH PHOTOELECTRIC CONVERSION EFFICIENCY

(71) Applicant: SHIN-ETSU CHEMICAL CO., LTD., Tokyo (JP)

(72) Inventors: Hiroshi Hashigami, Annaka (JP); Takenori Watabe, Annaka (JP); Hiroyuki Ohtsuka, Karuizawa-machi (JP); Ryo Mitta, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/076,173

(22) PCT Filed: Nov. 7, 2016

(86) PCT No.: PCT/JP2016/004824
§ 371 (c)(1),
(2) Date: Aug. 7, 2018

(87) PCT Pub. No.: WO2018/083722
PCT Pub. Date: May 11, 2018

(65) Prior Publication Data
US 2019/0181288 A1 Jun. 13, 2019

(51) Int. Cl.
*H01L 31/068* (2012.01)
*H01L 31/0224* (2006.01)
(Continued)

(52) U.S. Cl.
CPC .... *H01L 31/0682* (2013.01); *H01L 31/02167* (2013.01); *H01L 31/02168* (2013.01);
(Continued)

(58) Field of Classification Search
CPC .......... H01L 31/0682; H01L 31/02167; H01L 31/02168; H01L 31/022441;
(Continued)

(56) References Cited

U.S. PATENT DOCUMENTS 6,452,090 B2 * 9/2002 Takato ............ H01L 31/022425
136/249
8,809,097 B1 * 8/2014 Ravi ..................... H01L 31/056
438/57
(Continued)

FOREIGN PATENT DOCUMENTS

CN 102742025 A 10/2012
CN 102222726 B 6/2013
(Continued)

OTHER PUBLICATIONS

Aug. 24, 2018 Extended European Search Report issued in European Application No. 16886817.2.
(Continued)

*Primary Examiner* — Tamir Ayad
(74) *Attorney, Agent, or Firm* — Oliff PLC

(57) ABSTRACT

A back surface electrode type solar cell in which a p-type region having a p-conductive type, and an n-type region which has an n-conductive type and in which maximum concentration of additive impurities for providing the n-conductive type in a substrate width direction is equal to or higher than $5 \times 10^{18}$ atoms/cm$^3$ are disposed on a first main surface of a crystal silicon substrate, a first passivation film is disposed so as to cover the p-type region and the n-type region, and a second passivation film is disposed on a second main surface which is a surface opposite to the first main surface so as to cover the second main surface, the first passivation film and the second passivation film being formed with a compound containing oxide aluminum.

6 Claims, 7 Drawing Sheets

(51) Int. Cl.
*H01L 31/18* (2006.01)
*H01L 31/0216* (2014.01)

(52) U.S. Cl.
CPC .... *H01L 31/022441* (2013.01); *H01L 31/182* (2013.01); *H01L 31/1804* (2013.01); *Y02E 10/52* (2013.01); *Y02E 10/547* (2013.01); *Y02P 70/50* (2015.11)

(58) Field of Classification Search
CPC .............. H01L 31/1804; H01L 31/182; H01L 31/1816; Y02P 70/50; Y02E 10/52; Y02E 10/547
See application file for complete search history.

(56) References Cited

U.S. PATENT DOCUMENTS

| | | | |
|---|---|---|---|
| 9,379,258 B2* | 6/2016 | Kapur | H01L 27/1421 |
| 2009/0194162 A1* | 8/2009 | Sivaram | H01L 31/022425 136/258 |
| 2009/0314338 A1* | 12/2009 | Basore | H01L 31/02167 136/255 |
| 2010/0243041 A1 | 9/2010 | Carlson et al. | |
| 2011/0023962 A1* | 2/2011 | Fukui | H01L 31/035272 136/256 |
| 2011/0100457 A1* | 5/2011 | Kim | H01L 31/0682 438/57 |
| 2012/0111399 A1* | 5/2012 | Kondo | H01L 31/022441 136/256 |
| 2012/0174960 A1* | 7/2012 | Hashigami | H01L 31/1868 257/E31.124 |
| 2012/0325291 A1 | 12/2012 | Yokosawa et al. | |
| 2013/0069209 A1 | 3/2013 | Fujita et al. | |
| 2013/0098439 A1 | 4/2013 | Takaki et al. | |
| 2013/0118572 A1 | 5/2013 | Kim et al. | |
| 2014/0008587 A1* | 1/2014 | Yoshida | C03C 8/02 252/513 |
| 2015/0068591 A1 | 3/2015 | Chan et al. | |
| 2015/0083209 A1 | 3/2015 | Ooi et al. | |
| 2015/0243812 A1* | 8/2015 | Hardin | H01L 31/022425 136/256 |
| 2017/0170338 A1 | 6/2017 | Matsuo et al. | |
| 2019/0157478 A1 | 5/2019 | Watabe et al. | |
| 2020/0274009 A1 | 8/2020 | Watabe et al. | |

FOREIGN PATENT DOCUMENTS

| | | |
|---|---|---|
| CN | 103985781 A | 8/2014 |
| CN | 105789342 A | 7/2016 |
| CN | 105914249 A | 8/2016 |
| CN | 109891604 A | 6/2019 |
| EP | 3340316 A1 | 6/2018 |
| JP | 2008-010746 A | 1/2008 |
| JP | 2013-012667 A | 1/2013 |
| JP | 2013-143499 A | 7/2013 |
| JP | 2014-072450 A | 4/2014 |
| JP | 2015-507315 A | 3/2015 |
| JP | 2016-119346 A | 6/2016 |
| TW | 2013-06112 A | 2/2013 |
| TW | 2013-42632 A | 10/2013 |
| WO | 2014-014112 A1 | 1/2014 |
| WO | 2015/151422 A1 | 10/2015 |
| WO | 2016-051628 A1 | 4/2016 |

OTHER PUBLICATIONS

Muller et al. "Ion implantation for all-alumina IBC solar cells with floating emitter." Energy Procedia, 2014, vol. 55, pp. 265-271.
Carrio et al. "Rear contact pattern optimization based on 3D simulations for IBC solar cells with point-like doped contacts." Energy Procedia, 2014, vol. 55, pp. 47-52.
May 7, 2019 International Preliminary Report on Patentability issued in International Patent Application No. PCT/JP2016/004824.
Jan. 17, 2017 International Search Report issued in International Patent Application No. PCT/JP2016/004824.
Mulligan et al. "Manufacture of Solar Cells with 21% Efficiency." 19th European Photovoltaic Solar Energy Conference, Jun. 7-11, 2004, pp. 387-390.
Jul. 11, 2017 Japanese Office Action issued in Japanses Patent Application No. 2017-519721.
Oct. 31, 2017 Japanese Office Action issued in Japanese Patent Application No. 2017-519721.
Jan. 23, 2018 Japanese Office Action issued in Japanese Patent Application No. 2017-519721.
Apr. 17, 2018 Taiwanese Search Report issued in Taiwanese Patent Application No. 106106848.
Sep. 24, 2020 Office Action issued in European Patent Application No. 16886817.2.
Nov. 2, 2021 Office Action issued European Patent Application No. 16886817.2.
Nov. 10, 2021 Office Action issued Indian Patent Application No. 201847031960.
Lee et al. "Excellent passivation and low reflectivity Al2O3/TiO2 bilayer coatings for n-wafer silicon solar cells." Proceedings of 38th IEEE PVSC, Jun. 3, 2012, pp. 1066-1068.
Feb. 24, 2022 Office Action issued in Chinese Patent Application No. 201680090602.8.
Jan. 3, 2023 Office Action issued in Chinese Patent Application No. 201680090602.8.

\* cited by examiner

SOLAR CELL WITH HIGH PHOTOELECTRIC CONVERSION EFFICIENCY AND METHOD FOR MANUFACTURING SOLAR CELL WITH HIGH PHOTOELECTRIC CONVERSION EFFICIENCY

TECHNICAL FIELD

The present invention relates to a solar cell with high photoelectric conversion efficiency and a method for manufacturing the solar cell with high photoelectric conversion efficiency.

BACKGROUND ART

As a method for improving photoelectric conversion efficiency of a crystal silicon solar cell, in recent years, a so-called back surface electrode type solar cell, in which no electrodes are provided on a light receiving surface to eliminate optical loss due to shadow of electrodes, has been widely studied.

FIG. 10 is a cross-sectional schematic diagram illustrating a basic structure of the back surface electrode type solar cell. In FIG. 10, the light receiving surface faces downward in the drawing. In the back surface electrode type solar cell 1000, a p-type region 1002 in which additives for providing p-type conductivity are diffused in high concentration is formed, and an n-type region 1003 in which additives for providing n-type conductivity are diffused in high concentration is formed so as to be adjacent to the p-type region 1002, on a non-light receiving surface of a substrate 1001.

The p-type region 1002 and the n-type region 1003, and a surface (the light receiving surface) opposite to the regions are respectively covered with passivation films 1004 and 1005 for reducing loss due to recombination of photo-excited carriers. A positive electrode 1006 and a negative electrode 1007 are formed so as to penetrate the passivation film 1004. Further, while not illustrated in FIG. 10, on the light receiving surface of the substrate 1001, texture having several microns of roughness is formed for optical confinement.

Because there is no electrode on the light receiving surface of the back surface electrode type solar cell, it is necessary to make charge carriers which are mainly excited by short-wavelength light reach the back surface without being recombined. Actually, the surface of the substrate densely contains dangling bonds (silicon dangling bonds) which act as recombination centers of charge carriers. Thus, extremely high passivation performance is required for the passivation film 1005.

By the way, the recombination rate of charge carriers is the sum of the bulk recombination rate in the crystal bulk and the surface recombination rate on the crystal surface. Typically, in crystal silicon, as additive impurity concentration (charge carrier concentration at room temperature) becomes higher, bulk recombination increases. This is because a crystal defect due to additive impurities and direct recombination in Auger process are largely caused as the carrier concentration becomes higher. Therefore, typically in a high concentration region such as the p-type region 1002 and the n-type region 1003, carrier recombination loss on the back surface is prevented by reducing maximum additive impurity concentration in a substrate depth direction to, for example, a first half of $10^{18}$ atoms/cm$^3$ and covering the surface with an effective passivation film.

Further, surface passivation has two elements of a chemical termination and an electrical field effect. The electrical field effect is to generate an electric field on the surface of the substrate by fixed charges incorporated in the passivation film and reduce charge carrier concentration in the vicinity of the surface, thereby reducing recombination on the surface. In the solar cell, silicon nitride having positive charges and aluminum oxide having negative charges are typically often used for electrical field effect type passivation.

In principle, a passivation effect of the electrical field effect type passivation can be obtained regardless of a conductive type on the surface of the substrate to which the passivation is applied. However, if a film containing fixed charges having the same polarity as that of majority carriers on the surface of the substrate is applied and an electrode is formed on the same surface, it is known that minority carriers flow to an electrode having polarity opposite to that of an electrode to which the minority carriers should be normally collected, which reduces output of the solar cell.

To address this problem, Patent Literature 1 discloses an example where an aluminum oxide film is formed on a surface of a p-type region of a back surface electrode type solar cell, silicon oxide is applied on a surface of an n-type region, and silicon nitride is applied on a light receiving surface.

On the other hand, as a typical example of chemical termination type passivation, there is silicon oxide. While silicon oxide has positive charges, silicon oxide has lower density of fixed charges than that of typical silicon nitride by single to double digits depending on a manufacturing method, and has relatively low defect density at an interface with crystal silicon. Thus, silicon oxide is considered useful for both a p-type surface and an n-type surface. In an example disclosed in Non-Patent Literature 1 (Mulligan), silicon oxide is applied to both a light receiving surface and a back surface of a solar cell using an n-type substrate.

CITATION LIST

Patent Literature

Patent Literature 1: Japanese Unexamined Patent Application Publication No. 2008-010746

Non-Patent Literature

Non-Patent Literature 1: William P. Mulligan et al., Proceedings of 19th EUPVSEC pp. 387 to 390 (2004)

SUMMARY OF INVENTION

Technical Problem

However, there is a problem that, while a back surface structure in the solar cell of Patent Literature 1 has a high passivation effect, this structure requires patterning, which makes process complicated and results in higher cost. Further, while silicon nitride applied to passivation on the light receiving surface has high positive fixed charge density, and therefore a high electrical field effect can be expected, dangling bond termination capability is typically not high. Therefore, there is a problem that, while a sufficient passivation effect can be obtained by an electrical field effect on a high resistivity substrate, the passivation effect is significantly reduced on a low resistivity substrate from which a higher output voltage can be expected.

Further, because it is typically necessary to perform heat treatment at 700° C. to 1100° C. to form a silicon oxide film, there is a problem that characteristics of the solar cell degrade by additive impurities in a high concentration diffusion layer being diffused again or distributed again by demixing to a thermal oxide film. Meanwhile, there is a method of forming a silicon oxide film by immersing a substrate in nitric acid at room temperature or by exposing a substrate in an ozone atmosphere at approximately 200° C. to 450° C. However, this method has a problem that a sufficient passivation effect cannot be obtained, or stable quality cannot be obtained.

Therefore, when silicon oxide passivation is applied, as seen in the solar cell disclosed in Non-Patent Literature 1, there has been employed a method where a front surface field (FSF) is further formed at the light receiving surface side to provide an electric field effect on the light receiving surface, so that performance of the solar cell is improved.

However, the FSF is formed by thermally diffusing boron or phosphorus so that impurity concentration becomes lower than that in a high concentration layer to be formed on the back surface by single to double digits to suppress loss of long wavelength light due to free carrier absorption. Therefore, there is a problem that FSF forming process is additionally required, which makes manufacturing cost of the solar cell high.

The present invention has been made in view of the above-described problems, and it is an object of the present invention to provide an inexpensive solar cell with high photoelectric conversion efficiency. Further, it is an object of the present invention to provide a method for manufacturing a solar cell which can be easily manufactured and has a high passivation effect and high photoelectric conversion efficiency.

Solution to Problem

To achieve the above-described objects, the present invention provides a back surface electrode type solar cell in which a p-type region having a p-conductive type, and an n-type region which has an n-conductive type and in which maximum concentration of additive impurities for providing the n-conductive type in a substrate depth direction is equal to or higher than $5 \times 10^{18}$ atoms/cm$^3$ are disposed on a first main surface of a crystal silicon substrate, a first passivation film is disposed so as to cover the p-type region and the n-type region, a second passivation film is disposed on a second main surface which is a surface opposite to the first main surface so as to cover the second main surface, wherein the first passivation film and the second passivation film are formed with a compound containing aluminum oxide.

The first passivation film and the second passivation film formed with a compound containing aluminum oxide provides a high passivation effect on both the first and the second main surfaces, and thus enables the solar cell to have high photoelectric conversion efficiency. Further, this solar cell is inexpensive because it can be easily manufactured.

At this time, it is preferable that at least part of the second main surface has the same conductive type and conductivity as a conductive type and conductivity in a bulk portion of the crystal silicon substrate.

If at least part of the second main surface has the same conductive type and conductivity as the conductive type and conductivity in the bulk of the substrate, it is not necessary to provide a diffusion layer, or the like, on the second main surface, so that it is possible to provide an inexpensive solar cell whose structure is simple.

Further, it is preferable that an antireflective coat is further disposed on the second passivation film.

The antireflective coat disposed on the second passivation film can suppress reflection on the light receiving surface, so that it is possible to provide a solar cell with higher photoelectric conversion efficiency.

Further, it is preferable that a reflective coat is further disposed on the first passivation film.

The reflective coat disposed on the first passivation film can promote reflection on the back surface, so that it is possible to provide a solar cell with higher photoelectric conversion efficiency.

Further, it is preferable that the antireflective coat and the reflective coat contain at least one of silicon oxide, magnesium fluoride, silicon nitride, tin oxide and titanium oxide.

The reflective coat and the antireflective coat containing at least one of silicon oxide, magnesium fluoride, silicon nitride, tin oxide and titanium oxide are preferable as a reflective coat and an antireflective coat of the back surface electrode type solar cell, so that it is possible to provide a solar cell with more favorable characteristics.

Further, it is preferable that an area occupied by the p-type region is larger than an area occupied by the n-type region on the first main surface.

The passivation effect of the aluminum oxide is greater in the p-type region than in the n-type region. Thus, if the area occupied by the p-type region is larger, it is possible to provide a solar cell with higher photoelectric conversion efficiency.

Further, the present invention provides a photovoltaic module comprising the above solar cells electrically connected to each other.

It is possible to form a photovoltaic module by electrically connecting the solar cell of the present invention in this manner.

Further, the present invention provides a photovoltaic power generation system comprising a plurality of the above photovoltaic modules electrically connected to each other.

In this manner, it is possible to provide a photovoltaic power generation system by electrically connecting a plurality of the photovoltaic modules in which the solar cells of the present invention are electrically connected.

To achieve the above-described objects, the present invention provides a method for manufacturing solar cell, comprising:

forming a p-type region having a p-conductive type on a first main surface of a crystal silicon substrate;

forming an n-type region which has an n-conductive type and in which maximum concentration of additive impurities for providing the n-conductive type in a substrate depth direction is equal to or higher than $5 \times 10^{18}$ atoms/cm$^3$, on the first main surface;

forming a first passivation film so as to cover the p-type region and the n-type region;

forming a second passivation film on a second main surface which is a surface opposite to the first main surface so as to cover the second main surface;

forming a positive electrode in contact with a surface of the p-type region; and forming a negative electrode in contact with a surface of the n-type region, wherein the first passivation film and the second passivation film are formed with a compound containing aluminum oxide.

By forming the first passivation film and the second passivation film with the compound containing aluminum oxide in this manner, it is possible to manufacture a solar cell which has a high passivation effect on both the first and the second main surfaces, and thus has high photoelectric conversion efficiency. Further, because manufacturing process is simple, it is possible to manufacture an inexpensive solar cell with high productivity.

At this time, it is preferable that the method further includes forming an antireflective coat on the second passivation film.

By forming the antireflective coat on the second passivation film in this manner, reflection on the light receiving surface is suppressed, so that it is possible to manufacture a solar cell with higher photoelectric conversion efficiency.

Further, it is preferable that the method further includes forming a reflective coat on the first passivation film.

By forming the reflective coat on the first passivation film in this manner, reflection on the back surface is promoted, so that it is possible to manufacture a solar cell with higher photoelectric conversion efficiency.

Further, it is preferable that forming the positive electrode and forming the negative electrode comprises:

a sub-step of applying conductive paste on the first passivation film or the reflective coat; and a sub-step of performing heat treatment on the crystal silicon substrate, to which the conductive paste is applied, at 700° C. or more and 890° C. or less for 1 second or more and 10 minutes or less.

By forming the positive electrode and the negative electrode in this manner, it is possible to easily form the electrodes, which leads to better productivity, so that it is possible to manufacture an inexpensive solar cell.

Advantageous Effects of Invention

The solar cell of the present invention is inexpensive and has high photoelectric conversion efficiency. Further, the method for manufacturing solar cell of the present invention can increase a passivation effect of the passivation films, and easily manufacture a solar cell. Thus, it is possible to manufacture a solar cell with high photoelectric conversion efficiency at low cost.

DESCRIPTION OF EMBODIMENTS

As described above, in recent years, there has been a challenge for easily obtaining a high passivation effect in a back surface electrode type solar cell. The present inventors have studied hard a measure for obtaining such a high passivation effect and achieved the present invention.

The present invention will be described in detail below with reference to the drawings, but the present invention is not limited thereto.

Figure 1:
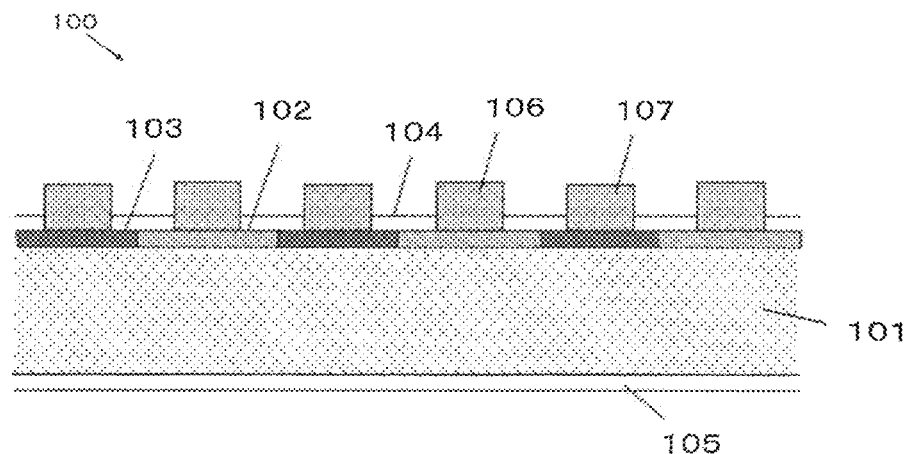
FIG. 1 is a cross-sectional schematic diagram illustrating an embodiment of a back surface electrode type solar cell according to the present invention.

Embodiments of the solar cell of the present invention will be specifically described below using FIG. 1. The solar cell of the present invention is a back surface electrode type solar cell 100 in which a p-type region 102 having a p-conductive type and an n-type region 103 which has an n-conductive type and in which maximum concentration of additive impurities for providing the n-conductive type in a substrate depth direction is equal, to or higher than $5 \times 10^{18}$ atoms/cm$^3$ are disposed on a first main surface (back surface) of a crystal silicon substrate 101, a first passivation film 104 is disposed so as to cover the p-type region 102 and the n-type region 103, and a second passivation film 105 is disposed on a second main surface which is a surface opposite to the first main surface, so as to cover the second main surface, and the first passivation film 104 and the second passivation film 105 are formed with a compound containing aluminum oxide. A positive electrode 106 and a negative electrode 107 are respectively disposed on the p-type region 102 and the n-type region 103.

The first passivation film 104 and the second passivation film 105 formed with the compound containing aluminum oxide provides a high passivation effect on both the first and the second main surfaces, and thus enables the solar cell to have high photoelectric conversion efficiency. Further, this solar cell is inexpensive because it can be easily manufactured.

In the solar cell, it is preferable that at least part of the second main surface has the same conductive type and conductivity as a conductive type and conductivity in a bulk portion of the crystal silicon substrate 101. If at least part of the second main surface has the same conductive type and conductivity as the conductive type and the conductivity in the bulk of the substrate, it is not necessary to provide a diffusion layer (e.g., an FSF layer), or the like, on the second main surface, so that it is possible to provide an inexpensive solar cell with a simple structure.

Figure 2:
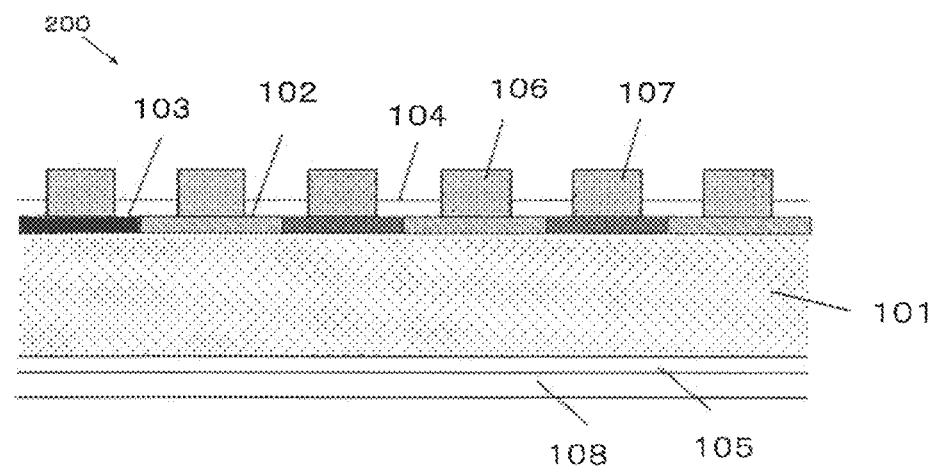
FIG. 2 is a cross-sectional schematic diagram illustrating another embodiment of the back surface electrode type solar cell according to the present invention.
Figure 3:
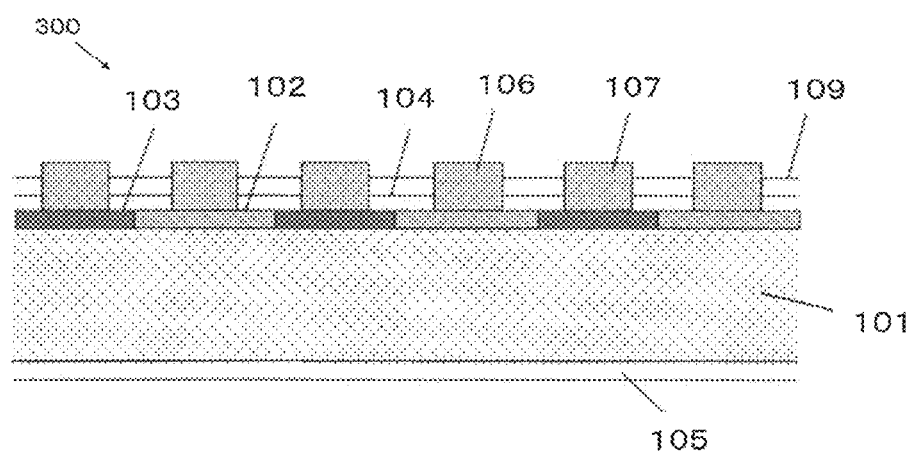
FIG. 3 is a cross-sectional schematic diagram illustrating still another embodiment of the back surface electrode type solar cell according to the present invention.
Figure 4:
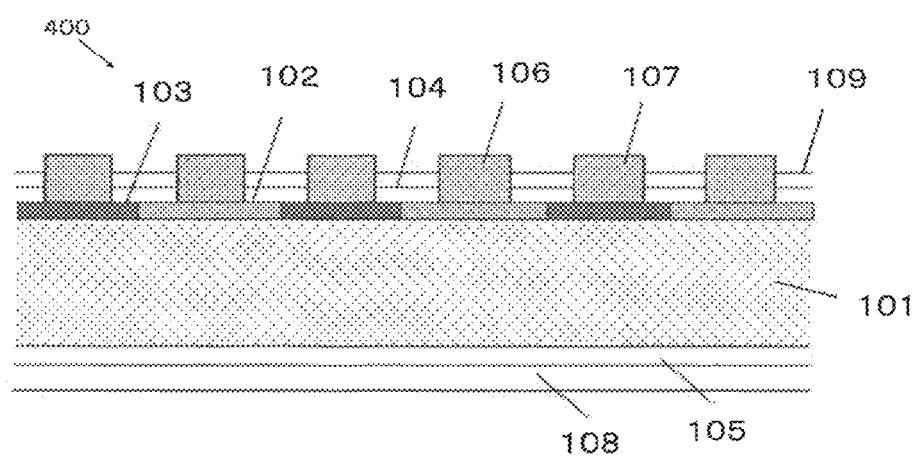
FIG. 4 is a cross-sectional schematic diagram illustrating still another embodiment of the back surface electrode type solar cell according to the present embodiment.

Further embodiments of the present invention will be described with reference to FIG. 2 to FIG. 4. In FIG. 2 to FIG. 4, the same reference numerals are assigned to the same components as those of the solar cell in FIG. 1.

As illustrated in FIG. 2, it is preferable that, in a solar cell 200 of the present invention, an antireflective coat 108 is further disposed on the second passivation film 105. The antireflective coat 108 disposed on the second passivation film 105 can suppress reflection on the light receiving surface, so that it is possible to provide a solar cell with higher photoelectric conversion efficiency.

Further, as illustrated in FIG. 3, it is preferable that, in a solar cell 300 of the present invention, a reflective coat 109 is further disposed on the first passivation film 104. The reflective coat 109 disposed on the first passivation film 104 can promote reflection on the back surface, so that it is possible to provide a solar cell with higher photoelectric conversion efficiency.

Further, as illustrated in FIG. 4, a solar cell 400 of the present invention can be configured such that the antireflective coat 108 is disposed on the second passivation film 105 while the reflective coat 109 is disposed on the first passivation film 104. By employing such a configuration, it is possible to provide a solar cell with further higher photoelectric conversion efficiency.

Further, it is preferable that the antireflective coat 108 and the reflective coat 109 contain at least one of silicon oxide, magnesium fluoride, silicon nitride, tin oxide and titanium oxide. Such a reflective coat and an antireflective coat are preferable as the reflective coat and the antireflective coat of the back surface electrode type solar cell, and it is possible to provide a solar cell with more favorable characteristics.

Further, it is preferable that, in the solar cell of any aspect of FIG. 1 to FIG. 4, an area occupied by the p-type region 102 is larger than an area occupied by the n-type region 103 on the first main surface. The passivation effect of aluminum oxide is greater in the p-type region than in the n-type region. Thus, if the area occupied by the p-type region is larger, it is possible to provide a solar cell with higher photoelectric conversion efficiency.

A method for manufacturing solar cell of the present invention will be now described. The method for manufacturing solar cell of the present invention is a manufacturing method of a back surface electrode type solar cell including forming a p-type region having a p-conductive type on a first main surface of a crystal silicon substrate, forming an n-type region having an n-conductive type on the first main surface, forming a first passivation film so as to cover the p-type region and the n-type region, forming a second passivation film on a second main surface which is a surface opposite to the first main surface so as to cover the second main surface, forming a positive electrode in contact with a surface of the p-type region, and forming a negative electrode in contact with a surface of the n-type region, the first passivation film and the second passivation film being formed with a compound containing aluminum oxide.

Figure 5:
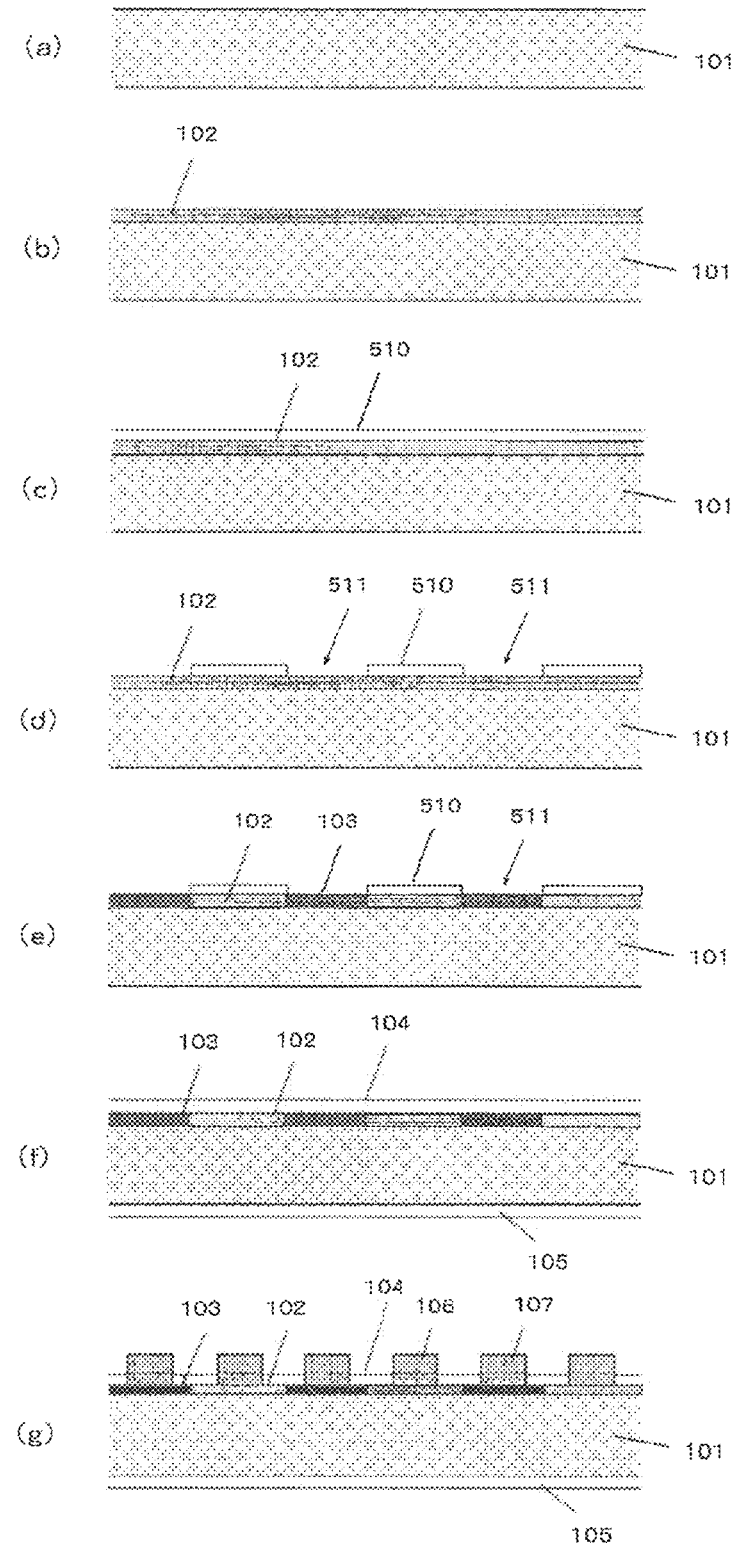
FIG. 5 is a process flowchart illustrating an example of a method for manufacturing the back surface electrode type solar cell according to the present invention.

An example of the method for manufacturing the solar cell (aspect in FIG. 1) of the present invention will be described below with reference to FIG. 5, while the present invention is not limited thereto.

The substrate 101 in FIG. 5(a) is, for example, a p-conductive type or an n-conductive type of crystal silicon having resistivity of 0.1 to 10 Ω·cm. While not illustrated, it is preferable that a roughness structure (texture) is formed on the surface of the substrate for optical confinement. The roughness structure can be obtained by immersing the substrate 101 in an acid or alkali solution for a predetermined period. As the acid solution, typically, a mixed acid solution of nitrohydrofluoric acid, acetic acid, phosphoric acid, sulfuric acid, water, or the like, is used. When the substrate 101 is immersed into this solution, minute grooves on the surface which gets rough upon processing of the substrate are preferentially etched, and thereby the roughness structure is formed. As the alkali solution, a potassium hydroxide aqueous solution, a sodium hydroxide aqueous solution or an aqueous solution of tetramethylammonium hydroxide may be used. Because the alkali etching progresses by forming Si—OH bond, its etching speed depends on crystal plane orientation, providing a roughness structure where a surface having low etching speed is exposed.

A non-light receiving surface of the substrate 101 does not necessarily require a roughness structure. The surface would be rather flattened to reduce a surface area, as an effect of reducing carrier recombination loss could be expected. In this case, spin etching using chemical containing nitrohydrofluoric acid or an in-line type one side cleaning apparatus can be utilized.

It is preferable that, after the roughness structure is formed, the substrate is cleaned with an acid aqueous solution of hydrochloric acid, sulfuric acid, nitric acid, hydrofluoric acid, or the like, or a mixed solution of these. In terms of cost and characteristics, it is preferable to clean the substrate in hydrochloric acid. To improve cleanliness, the substrate may be cleaned in a hydrochloric acid solution in which hydrogen peroxide of 0.5 to 5% is mixed and heated to 60 to 90° C.

Then, as illustrated in FIG. 5(b), the p-type region 102 is formed on one surface (the first main surface) of the substrate 101. While a diffusion source containing group III element can be used to form the p-type region, in terms of electric characteristics and simplicity of the apparatus, it is preferable to perform vapor-phase diffusion at 900 to 1000° C. using, for example, boron bromide. In the solar cell of the present invention, it is necessary to form the p-type region only on the back surface. To achieve this, it is preferable to add a twist of performing diffusion in a state where two substrates are superimposed or forming a diffusion barrier such as silicon nitride on the light receiving surface side so that boron is not diffused on the light receiving surface. Further, it is also possible to form the p-type region 102 by performing heat diffusion at 900° C. to 1000° C. after a boron compound is applied on the substrate 101 and dried, instead of vapor-phase diffusion. According to this method, it is possible to relatively easily suppress boron diffusion to a non-applied surface.

A maximum value of additive impurity concentration in the p-type region 102 in a substrate depth direction is preferably between $5\times10^{18}$ atoms/cm$^3$ and $5\times10^{20}$ atoms/cm$^3$, and, more preferably, between $8\times10^{18}$ atoms/cm$^3$ and $5\times10^{19}$ atoms/cm$^3$ approximately. If the concentration is lower than $5\times10^{18}$ atoms/cm$^3$, contact resistance between the substrate 101 and the electrode becomes large; and if the concentration exceeds $5\times10^{20}$ atoms/cm$^3$, a defect in a p+ region and recombination of charge carriers by Auger recombination are significantly caused, and output of the solar cell degrades.

Then, as illustrated in FIG. 5(c), a diffusion barrier 510 is formed on the p-type region 102. As the diffusion barrier, a silicon nitride film or a silicon oxide film which can be obtained through a chemical vapor deposition method or a physical vapor deposition method can be preferably used. Although depending on a film manufacturing method, the film is preferably formed with a thickness of appropriately 50 to 400 nm. A silicon oxide film obtained through heat treatment may be used instead of them. In this case, the substrate 101 is subjected to heat treatment in an oxide or water vapor atmosphere at 700 to 1100° C. to grow silicon oxide 20 to 200 nm.

Subsequently, as illustrated in FIG. 5(d), the diffusion barrier 510 at a portion where the n-type region is to be formed is partially removed to form an opening portion 511 so as to expose the p-type region 102. The diffusion barrier 510 can be removed by, for example, screen printing etching paste at a desired portion and performing heat treatment at 100 to 400° C. Further, it is also possible to use laser ablation whose process is simpler.

While optimal design is desired for an opening area at this time depending on a conductive type of the substrate 101, typically, an area of a high concentration layer which becomes an emitter is proportional to characteristics of the solar cell. While aluminum oxide used in the present invention can be also applied in the n-type region, a higher effect can be provided in the p-type region than in the n-type region. Given this property, in the present invention, a higher effect can be expected in the back surface electrode type solar cell using an n-type substrate.

Then, as illustrated in FIG. 5(e), the n-type region 103 is formed in the opening portion 511 of the diffusion barrier. In this manner, the n-type region having the n-conductive type is formed on the first main surface of the substrate 101. While the n-type region 103 can be formed with a diffusion source containing group V element, in terms of electric characteristics and simplicity of the apparatus, it is preferable to perform vapor-phase diffusion at 800 to 980° C. using, for example, phosphorous oxychloride. In the solar cell of the present invention, it is necessary to form the n-type region 103 only on the back surface (the first main surface). To achieve this, it is preferable to add a twist of performing diffusion in a state where two substrates are superimposed or forming a diffusion barrier (not illustrated) such as silicon nitride on the light receiving surface side so that phosphorus is not diffused on the light receiving surface. Further, it is also possible to form the n-type region 103 by performing heat diffusion at 800 to 980° C. after a phosphorous compound is applied on the substrate and dried, other than by performing vapor-phase diffusion. According to this method, it is possible to relatively easily suppress phosphorus diffusion to a non-applied surface.

Phosphorus diffusion may be also performed after the p-type region 102 exposed at the opening portion 511 of the diffusion barrier (for example, an oxide film) is removed by etching, as an alternative way to the above-described method. In this case, for example, by immersing the substrate 101 in a sodium hydroxide aqueous solution or a potassium hydroxide aqueous solution, only an exposed portion of the p-type region 102 can be removed by the oxide film formed on the surface functioning as a mask.

A maximum value of impurity concentration of the n-type region 103 in a substrate depth direction is preferably equal to or higher than $5 \times 10^{18}$ atoms/cm$^3$ in terms of relationship with an electrical field effect of an aluminum oxide film which will be described below.

Passivation ability by the electrical field effect is determined according to fixed charge density of aluminum oxide and carrier density on the surface of the substrate. If there is negative fixed charges on a surface of the n-type region in which additive impurity concentration is lower than $5 \times 10^{18}$ atoms/cm$^3$, holes of minority carriers collect on the surface and conditions largely shift to inversion conditions. By this means, a ratio of carrier recombination on the surface of the n-type region decreases. However, on the other hand, minority carriers recombined at the electrode increases, which results in degradation of characteristics of the solar cell. While an electrical field effect decreases in a region where additive impurity concentration is equal to or higher than $5 \times 10^{18}$ atoms/cm$^3$, because aluminum oxide has high chemical termination capability on the surface of the crystal silicon, a passivation effect can be expected. This effect is considered to be caused by a silicon oxide film composed of several atomic layers that are formed at an interface between silicon and aluminum oxide upon formation of an aluminum oxide film.

On the other hand, if additive impurity concentration exceeds approximately $1 \times 10^{21}$ atoms/cm$^3$, there is a possibility that output of the solar cell may degrade as a result of a defect in the n-type region and recombination of charge carriers by Auger recombination becoming obvious. Therefore, it is preferable that additive impurity concentration is equal to or lower than $1 \times 10^{21}$ atoms/cm.

Figure 6:
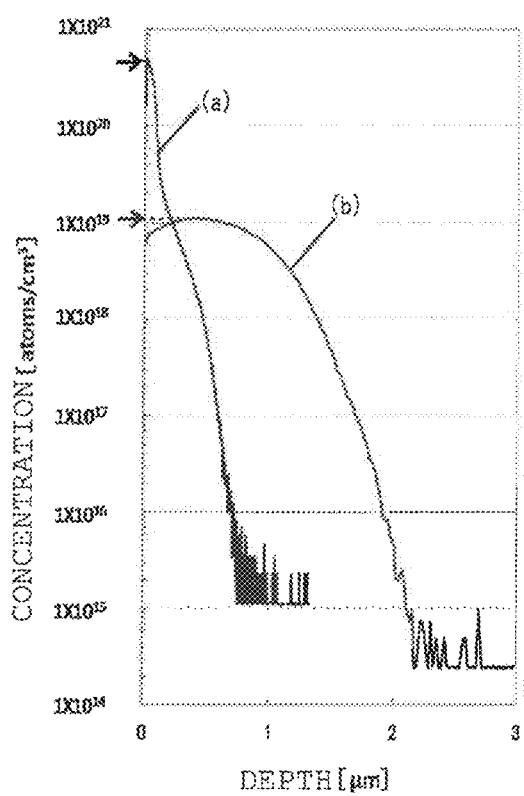
FIG. 6 is a diagram illustrating an example of concentration distribution of impurities in a substrate depth direction.

The above-described impurity concentration in the p-type region 102 and the n-type region 103 can be easily measured using a secondary ion mass spectrometry. FIG. 6 illustrates an example of boron concentration distribution ((a) in FIG. 6) and phosphorus concentration distribution ((b) in FIG. 6) measured using this method. While a shape of concentration distribution varies with additive impurities and diffusion conditions, a value indicated with an arrow in FIG. 6 is maximum concentration of the additive impurities in the substrate depth direction.

Figure 7:
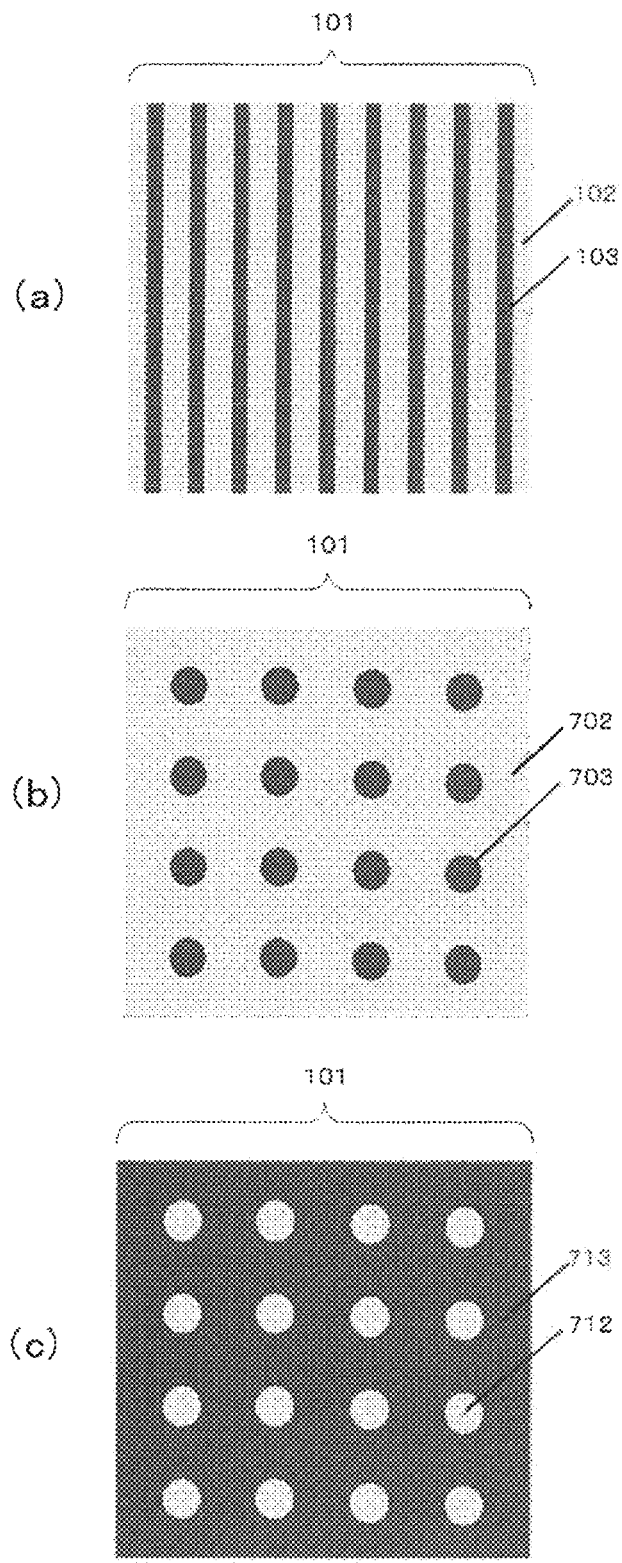
FIG. 7 is a schematic diagram illustrating a back surface structure of the back surface electrode type solar cell according to the present invention.

A pattern for forming the p-type region and the n-type region may be, for example, a pattern in which the p-type region 102 and the n-type region 103 are linearly adjacent as illustrated in FIG. 7(a). Further, as illustrated in FIG. 7(b), an island-shaped n-type region 703 may be formed in the p-type region 702, or as illustrated in FIG. 7(c), an island-shaped p-type region 712 may be formed in the n-type region 713.

The order of forming the p-type region and forming the n-type region may be reverse.

After phosphorus diffusion, boron glass, a diffusion barrier and phosphorus glass formed on the diffusion surface are removed with hydrofluoric acid or the like. To maintain cleanliness of the surface of the substrate 101, more preferably, the substrate may be cleaned with a solution in which ammonia water or an aqueous solution of tetramethylammonium hydroxide is mixed with hydrogen peroxide of 0.5 to 5% and is heated at 60 to 90° C. In addition, the substrate may be cleaned with hydrochloric acid, sulfuric acid, nitric acid or a mixed solution of these, or a solution in which these are mixed with hydrogen peroxide of 0.5 to 5% and is heated at 60 to 90° C. Further, it is preferable to remove an oxide film with an aqueous solution of hydrofluoric acid in the last stage of cleaning.

Then, as illustrated in FIG. 5(f), a first passivation film 104 is formed on the p-type region 102 and the n-type region 103, and, further, a second passivation film 105 is formed on an opposite surface (the second main surface). Both passivation films are formed with a compound containing aluminum oxide. As a method for forming an aluminum oxide film, a chemical vapor deposition method such as plasma CVD, atmospheric pressure CVD and low pressure CVD is mainly used other than an atomic layer deposition method. In these methods, tetramethylaluminum is used as a precursor, and, in the case where a carrier gas is introduced to the precursor, hydrogen, argon or nitrogen is typically used. As an oxidant of aluminum, oxygen, carbon dioxide, nitrous oxide, water, ozone, or the like, can be used.

Further, a vacuum deposition method or a sputtering method may be used to form a passivation film containing aluminum oxide. Alternatively, the passivation film may be formed by a sol-gel method using a compound such as aluminum alkoxide, or the like.

The first passivation film 104 and the second passivation film 105 may be formed on both surfaces at the same time, or the films may be separately formed on each surface. In the case where the films are formed at the same time, an atomic layer deposition method is suitable. In this case, the substrate 101 is provided in a reaction chamber kept at approximately 100 to 350° C. so that the both surfaces are exposed to a reaction gas, and an oxidation gas and a precursor are alternately introduced and gas-exchanged, whereby an aluminum oxide film is formed.

Compositions of the first passivation film 104 and the second passivation film 105 may differ. To form such films for each surface, a conventional flat plate plasma CVD, a sputtering method, a sol-gel method, or the like, is suitable.

The thickness of the first passivation film 104 and the second passivation film 105 is preferably equal to or greater than 0.5 nm, more preferably, from 3 nm to 30 nm (between 3 nm and 30 nm). By making the film thickness of the first and second passivation films fall within this film thickness range, it is possible to realize coverage of the passivation film with respect to the substrate 101 and a passivation effect at the same time.

Further, in the case where the first passivation film 104 also has a function as a reflective coat for reflecting light reaching the back surface of the solar cell to the substrate again, the film thickness is preferably between 70 nm and 200 nm, more preferably between 80 nm and 100 nm. If the film thickness is between 70 nm and 200 nm, a function as the reflective coat can be favorably exerted.

To improve light reflection of the back surface of the substrate, as illustrated in FIG. 3, a reflective coat 109 formed with a compound other than aluminum oxide may be further formed on the first passivation film 104. As the reflective coat 109, silicon oxide, magnesium fluoride, silicon nitride, tin oxide, titanium oxide, or the like, can be used. These films may be formed using a chemical vapor deposition method, a sputtering method, a vacuum deposition method, or the like. While the film thickness of the reflective coat 109 depends on the film thickness of the first passivation film 104 and refractive index of the reflective coat 109, the film thickness is preferably approximately 80 to 250 nm.

Meanwhile, in the case where the second passivation film 105 also has a function as an antireflective coat, the film thickness is preferably between 70 nm and 200 nm, more preferably between 80 nm and 150 nm. If the film thickness of the second passivation film 105 is between 70 nm and 200 nm, the function as a reflective coat can be favorably exerted.

Further, to improve an antireflective effect of the light receiving surface, as illustrated in FIG. 2, an antireflective coat 108 formed with a compound other than aluminum oxide may be further formed on the second passivation film 105. As the antireflective coat 108, silicon oxide, magnesium fluoride, silicon nitride, tin oxide, titanium oxide, or the like, can be used. These films may be formed using a chemical vapor deposition method, a sputtering method, a vacuum deposition method, or the like. While the film thickness of the antireflective coat 108 depends on the film thickness of the second passivation film 105 and refractive index of the antireflective coat, the film thickness is preferably approximately 50 to 120 nm.

Further, as illustrated in FIG. 4, it is also possible to form a laminate of the passivation film 104 and the reflective coat 109 on the back surface of the solar cell and form a laminate of the passivation film 105 and the antireflective coat 108 on the light receiving surface by combining features of FIG. 2 and FIG. 3.

Depending on a manufacturing method, it is known that a passivation effect of the aluminum oxide film is improved by subjected the film to heat treatment at 300 to 600° C. In the case where a film forming temperature is lower than this temperature range, it is preferable that, after the aluminum oxide film is formed, the film is subjected to heat treatment for 5 to 20 minutes in an inert gas atmosphere in the above-described temperature range or in a hydrogen-mixed nitrogen atmosphere having a hydrogen concentration of 2 to 10%, before the antireflective coat or the reflective coat is laminated.

Then, as illustrated in FIG. 5(g), a positive electrode 106 is formed on the p-type region 102, and a negative electrode 107 is formed on the n-type region 103. Forming the positive electrode 106 and forming the negative electrode 107 may include a sub-step of applying conductive paste on the first passivation film 104 or the reflective coat 109, and a sub-step of performing heat treatment on the crystal silicon substrate 101, to which the conductive paste is applied, at 700° C. or more and 890° C. or less for 1 second or more and 10 minutes or less. An electrode forming method is preferably, but is not particularly limited to, screen printing or dispenser formation using the conductive paste, in terms of productivity. Specifically, the positive electrode 106 and the negative electrode 107 can be formed by applying an Ag paste in which Ag powder and glass flit are mixed with an organic binder on the p-type region 102 and the n-type region 103 through the passivation film 104, drying the Ag paste, and firing the substrate for between 1 second and 30 minutes, preferably between 1 second and 10 minutes at a temperature approximately between 700° C. and 890° C. Through this heat treatment, the passivation film 104 or the passivation film 104 and the reflective coat is/are eroded by the Ag paste, whereby the electrode electrically is brought into electrical contact with the silicon.

Further, it is also possible to apply plating to form the electrode. In this case, because it is necessary to expose a portion where the electrode is to be formed on the surface of the substrate, it is possible to remove the passivation film 104 at the portion through, for example, laser ablation.

Figure 8:
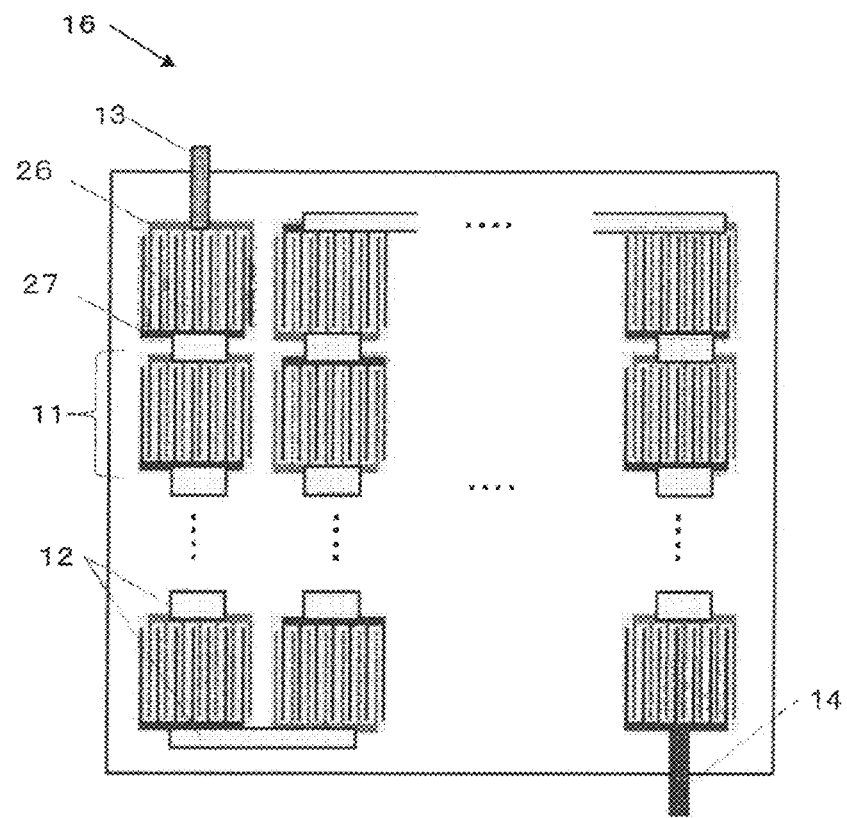
FIG. 8 is an overview diagram illustrating an example of a photovoltaic module according to the present invention.

By electrically connecting a plurality of the above-described solar cells of the present invention, a photovoltaic module can be obtained. FIG. 8 is an overview diagram illustrating an example of a configuration of a non-light receiving surface of the photovoltaic module 16 constituted by electrically connecting the solar cells of the present invention. The positive electrode 26 of the solar cell is electrically connected to the negative electrode 27 of the adjacent solar cell through a tab 12, and the required number of solar cells 11 to achieve predetermined output are connected. The connected solar cells 11 are sealed with cover glass, a filler, and, further, a backsheet while not illustrated. As the cover glass, soda-lime glass is widely used. Further, as the filler, ethylene vinyl acetate, polyolefin, silicone, or the like, is used. As the backsheet, a functional film using polyethylene terephthalate is typically used. In addition, the positive electrode 26 of one solar cell is connected to a positive electrode terminal 13 of the photovoltaic module 16, and the negative electrode 27 of another solar cell is connected to a negative electrode terminal 14 of the photovoltaic module 16.

Figure 9:
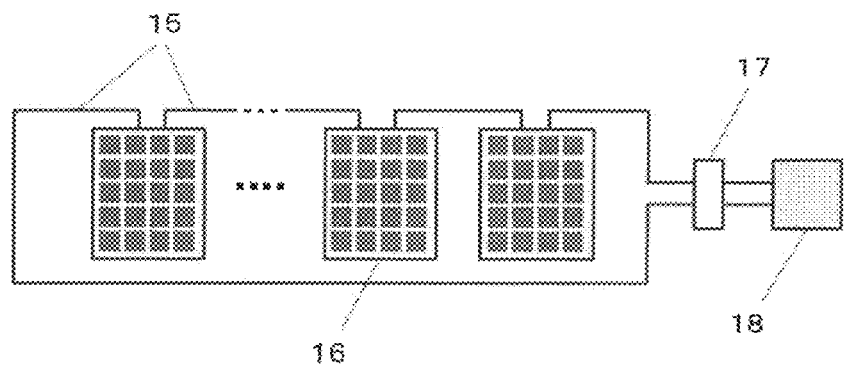
FIG. 9 is a schematic diagram of a photovoltaic power generation system according to the present invention.
Figure 10:
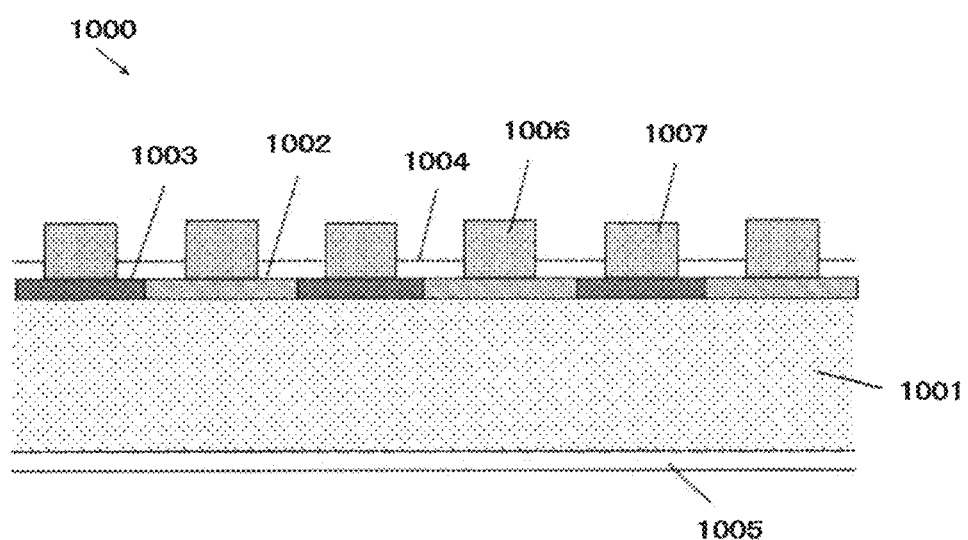
FIG. 10 is a cross-sectional schematic diagram of a typical back surface electrode type solar cell.

FIG. 9 illustrates a basic configuration of a photovoltaic power generation system in which the photovoltaic modules 16 of the present invention are connected. The photovoltaic power generation system of the present invention is constituted by electrically connecting a plurality of the above-described photovoltaic modules 16 of the present invention. As illustrated in FIG. 9, the plurality of photovoltaic modules 16 are connected in series through wiring 15 and supply generated power to an external load circuit 18 via an inverter 17. While not illustrated in FIG. 9, the system may further include a secondary cell which stores the generated power.

EXAMPLE

The present invention will be more specifically described below using examples and comparative examples, but the present invention is not limited to these.

Example 1

In a phosphorus-doped <100> n-type as-cut silicon substrate of 150 mm square, having a thickness of 200 µm and having specific resistance of 1 Ω·cm, after a damage layer was removed with a hot concentrated potassium hydroxide aqueous solution, the substrate was immersed in a 5% potassium hydroxide aqueous solution at 80° C. for 20 minutes to form texture in a random pyramid shape, and, continuously, cleaned in a mixed solution of hydrochloric acid and hydrogen peroxide.

Subsequently, a mixture of a boron compound and a binder was spin coated on the back surface of the substrate, and boron was diffused through heat treatment at 1000° C. for 30 minutes to form a p-type region. Then, continuously, oxidizing heat treatment was performed at 1000° C. for 2 hours to form an oxide film (silicon oxide film). After the oxide film was formed, the oxide film at a portion where an n-type region was to be formed on the back surface of the substrate was removed in a line shape using laser radiation with a wavelength of 532 nm.

Then, the substrates were loaded on a quartz board such that light receiving surfaces of a pair of two substrates faced each other, and heat treatment was performed at 820° C. for 30 minutes by using phosphorous oxychloride to form an n-type region. After this process, peak impurity concentration of the p-type region and the n-type region in a substrate depth direction was measured by using arbitrarily extracted samples through a secondary ion mass spectrometry. As a result, the peak concentration was $5 \times 10^{19}$ atoms/cm$^3$ in the p-type region, and $3 \times 10^{19}$ atoms/cm$^3$ in the n-type region.

After the substrate was immersed in a 10% HF aqueous solution to remove a glass layer and an oxide film, the substrate was cleaned by being sequentially immersed in a mixed solution of hydrochloric acid water and hydrogen peroxide water at 80° C., and a 2% HF aqueous solution, and the substrate was rinsed with pure water and then dried.

Aluminum oxide having a film thickness of 100 nm was formed on the light receiving surface of the cleaned substrate using an atomic layer deposition method, and further, aluminum oxide having a film thickness of 10 nm was formed on the back side. Then, the substrate was subjected to heat treatment at 450° C. for 15 minutes in a nitrogen atmosphere. On the back surface of the substrate, a silicon nitride film having a film thickness of 90 nm was further formed using plasma CVD.

A solar cell was obtained by applying Ag paste on the above-described p-type region and n-type region through screen printing, and curing the Ag paste through heat treatment at 800° C. for 3 seconds. Finally, output characteristics of the solar cell were measured with pseudo sunlight using a xenon lamp as a light source.

Example 2

On the back surface of the substrate in which the p-type region and the n-type region were formed in Example 1, aluminum oxide having a film thickness of 100 nm was formed using an atomic layer deposition method, and, further, aluminum oxide having a film thickness of 10 nm was formed on the light receiving surface. Then, the substrate was subjected to heat treatment for 15 minutes at 450° C. in a nitrogen atmosphere. On the light receiving surface of the substrate, a silicon nitride film having a film thickness of 90 nm was further formed using plasma CVD.

A solar cell was obtained by applying Ag paste on the above-described p-type region and n-type region through screen printing, and curing the Ag paste through heat treatment at 800° C. for 3 seconds. Finally, output characteristics of the solar cell were measured with pseudo sunlight using a xenon lamp as a light source.

Example 3

Aluminum oxide having a film thickness of 10 nm was formed using an atomic layer deposition method on both surfaces of the substrate on which the p-type region and the n-type region were formed in Example 1, and then, the substrate was subjected to heat treatment at 450° C. for 15 minutes in a nitrogen atmosphere. On the both surfaces of the substrate, a silicon nitride film having a film thickness of 90 nm was further formed using plasma CVD.

A solar cell was obtained by applying Ag paste on the above-described p-type region and n-type region through screen printing, and curing the Ag paste through heat treatment at 800° C. for 3 seconds. Finally, output characteristics of the solar cell were measured with pseudo sunlight using a xenon lamp as a light source.

Example 4

The same solar cell as that of Example 1 was manufactured using a boron-doped <100> p-type as-cut silicon substrate of 150 mm square, having a thickness of 200 µm and having specific resistance of 1 Ω·cm. Then, output characteristics of the solar cell were measured with pseudo sunlight using a xenon lamp as a light source.

Example 5

In a phosphorus-doped <100> n-type as-cut silicon substrate of 150 mm square, having a thickness of 200 µm and having specific resistance of 1 Ω·cm, after a damage layer was removed with a hot concentrated potassium hydroxide aqueous solution, the substrate was immersed in a 5% potassium hydroxide aqueous solution at 80° C. for 20 minutes to form texture in a random pyramid shape, and, continuously, cleaned in a mixed solution of hydrochloric acid and hydrogen peroxide.

Then, a mixture of a boric acid compound and a binder was spin coated on the back surface of the substrate, and boron was diffused through heat treatment at 1000° C. for 30 minutes to form a p-type region. Then, continuously, oxidizing heat treatment was performed at 1000° C. for 2 hours to form an oxide film. After the oxide film was formed, the oxide film at a portion where an n-type region was to be formed on the back surface of the substrate was removed in an island shape using laser radiation with a wavelength of 532 nm. In this example, an area occupied by the n-type region was reduced by 25% compared to Example 1.

Then, the substrates were loaded on a quartz board such that light receiving surfaces of a pair of two substrates faced each other, and heat treatment was performed at 820° C. for 30 minutes by using phosphorous oxychloride to form an n-type region. After this process, peak impurity concentration of the p-type region and the n-type region in a substrate depth direction was measured by using arbitrarily extracted samples through a secondary ion mass spectroscopic method. As a result, the peak concentration was $5 \times 10^{19}$ atoms/cm$^3$ in the p-type region, and $3 \times 10^{19}$ atoms/cm$^3$ in the n-type region.

After the substrate was immersed in a 10% HF aqueous solution to remove a glass layer and an oxide film, the substrate was cleaned by being sequentially immersed in a mixed solution of hydrochloric acid water and hydrogen peroxide water at 80° C., and a 2% HF aqueous solution, and the substrate was rinsed with pure water and then dried.

Aluminum oxide having a film thickness of 10 nm was formed on the both surfaces of the substrate using an atomic layer deposition method. Then, the substrate was subjected to heat treatment at 450° C. for 15 minutes in a nitrogen atmosphere. A silicon nitride film having a film thickness of 90 nm was further formed on the both surfaces of the substrate using plasma CVD.

A solar cell was obtained by applying Ag paste on the above-described p-type region and n-type region through screen printing, and curing the Ag paste through heat treatment at 800° C. for 3 seconds. Finally, output characteristics of the solar cell were measured with pseudo sunlight using a xenon lamp as a light source.

Comparative Example 1

On the back surface of the substrate in which the p-type region and the n-type region were formed in Example 1, aluminum oxide having a film thickness of 10 nm was formed using an atomic layer deposition method. Then, after the p-type region was covered with acid resist by screen printing and dried, aluminum oxide on the exposed n-type region was removed with a 2% hydrofluoric acid aqueous solution. After the acid resist was removed and the substrate was cleaned, the substrate was subjected to heat treatment at 450° C. for 15 minutes in a nitrogen atmosphere. On the both surfaces of the substrate, a silicon nitride film having a film thickness of 90 nm was further formed using plasma CVD.

A solar cell was obtained by applying Ag paste on the above-described p-type region and n-type region through screen printing, and curing the Ag paste through heat treatment at 800° C. for 3 seconds. Finally, output characteristics of the solar cell were measured with pseudo sunlight using a xenon lamp as a light source.

Comparative Example 2

A phosphorus diffusion source in which a phosphorus compound and a binder were mixed was applied on the light receiving surface of the substrate in which the p-type region and the n-type region were formed in Example 1, and heat treatment was performed at 820° C. for 10 minutes in a state where applied surfaces faced each other to form an FSF layer on the light receiving surface. Then, after the substrate was immersed in a 10% HF aqueous solution to remove a glass layer, the substrate was cleaned by being sequentially immersed in a mixed solution of hydrochloric acid water and hydrogen peroxide water at 80° C., and a 2% HF aqueous solution, and the substrate was rinsed with pure water and then dried.

Then, aluminum oxide having a film thickness of 10 nm was formed on the both surfaces of the substrate using an atomic layer deposition method. Then, the p-type region was covered with acid resist using screen printing, and the substrate was dried, aluminum oxide on the exposed n-type region was removed with a 2% hydrofluoric acid aqueous solution. After the acid resist was removed and the substrate was cleaned, the substrate was subjected to heat treatment at 450° C. for 15 minutes in a nitrogen atmosphere. On the both surfaces of the substrate, a silicon nitride film having a film thickness of 90 nm was further formed using plasma CVD.

A solar cell was obtained by applying Ag paste on the above-described p-type region and n-type region through screen printing, and curing the Ag paste through heat treatment at 800° C. for 3 seconds. Finally, output characteristics of the solar cell were measured with pseudo sunlight using a xenon lamp as a light source.

Comparative Example 3

A phosphorus diffusion source in which a phosphorus compound and a binder were mixed was applied on the light receiving surface of the substrate in which the p-type region and the n-type region were formed in Example 1, and heat treatment was performed at 820° C. for 10 minutes in a state where applied surfaces faced each other to form an FSF layer on the light receiving surface. Then, after the substrate was immersed in a 10% HF aqueous solution to remove a glass layer, the substrate was cleaned by being sequentially immersed in a mixed solution of hydrochloric acid water and hydrogen peroxide water at 80° C., and a 2% HF aqueous solution, and the substrate was rinsed with pure water and then dried.

Then, the substrate was subjected to heat treatment at 900° C. for 10 minutes in an oxygen atmosphere to form a silicon oxide film (having a film thickness of approximately 10 nm) on the both surfaces of the substrate. A silicon nitride film having a film thickness of 90 nm was further formed on the both surfaces of the substrate using plasma CVD.

A solar cell was obtained by applying Ag paste on the above-described p-type region and n-type region through screen printing, and curing the Ag paste through heat treatment at 800° C. for 3 seconds. Finally, output characteristics of the solar cell were measured with pseudo sunlight using a xenon lamp as a light source.

Comparative Example 4

In a solar cell manufactured through the same process as in Example 3, phosphorus diffusion conditions were adjusted so that peak impurity concentration of the n-type region in a substrate depth direction was $3 \times 10^{18}$ atoms/cm$^3$. Finally, output characteristics of the solar cell were measured using pseudo sunlight using a xenon lamp as a light source.

Comparative Example 5

Oxide aluminum having a film thickness of 10 nm was formed using an atomic layer deposition method on the light receiving surface of the substrate in which the p-type region and the n-type region were formed in Example 4, and the substrate was subjected to heat treatment at 450° C. for 15 minutes in a nitrogen atmosphere. A silicon nitride film having a film thickness of 90 nm was further formed on the both surfaces of the substrate using plasma CVD.

A solar cell was obtained by applying Ag paste on the above-described p-type region and n-type region through screen printing, and curing the Ag paste through heat treatment at 800° C. for 3 seconds. Finally, output characteristics of the solar cell were measured with pseudo sunlight using a xenon lamp as a light source.

Characteristics of the solar cells in Examples 1 to 5 and Comparative Examples 1 to 5 are shown in Table 1. In Table 1, $J_{sc}$ indicates a short-circuit current, $V_{oc}$ indicates an open circuit voltage, FF indicates a fill factor, and Eff. indicates conversion efficiency. Conversion efficiency of the solar cells according to the present invention were all equal to or higher than 22.0%, and exhibited higher conversion efficiency than that in Comparative Examples. Further, the result of Example 5 indicates that the present invention was particularly effective in a solar cell structure in which an area occupied by the p-type region was larger.

TABLE 1

|  | Jsc [mA/cm$^2$] | Voc [mV] | FF | Eff. [%] |
|---|---|---|---|---|
| Example 1 | 39.7 | 0.688 | 0.805 | 22.0 |
| Example 2 | 40.3 | 0.689 | 0.802 | 22.3 |
| Example 3 | 40.8 | 0.688 | 0.803 | 22.5 |
| Example 4 | 40.8 | 0.688 | 0.805 | 22.6 |
| Example 5 | 41.1 | 0.692 | 0.800 | 22.8 |
| Comparative Example 1 | 38.8 | 0.682 | 0.805 | 21.3 |
| Comparative Example 2 | 39.5 | 0.682 | 0.807 | 21.7 |
| Comparative Example 3 | 38.5 | 0.686 | 0.803 | 21.2 |
| Comparative Example 4 | 39.6 | 0.653 | 0.794 | 20.5 |
| Comparative Example 5 | 39.9 | 0.679 | 0.807 | 21.9 |

It should be noted that the present invention is not limited to the above-described embodiments. The above-described embodiments are examples, and any invention which has substantially the same configuration and provides the same operational effects as those of the technical idea recited in the claims of the present invention is incorporated into the technical scope of the present invention.

The invention claimed is:

1. A method for manufacturing a solar cell, comprising:
    forming a p-type region having a p-conductive type on a first main surface of a crystal silicon substrate by performing vapor-phase diffusion using boron bromide in a state where two substrates are superimposed or by performing heat diffusion at a temperature in a range of 900° C. to 1000° C. after a boron compound is applied on the substrate;
    forming an n-type region which has an n-conductive type and in which a maximum concentration of additive impurities that are diffused into the crystal silicon substrate for providing the n-conductive type in a substrate depth direction is equal to or higher than $5\times10^{18}$ atoms/cm$^3$, on the first main surface by performing vapor-phase diffusion at a temperature in a range of 800 to 980° C. using phosphorous oxychloride in a state where two substrates are superimposed or in a state where a diffusion barrier is formed on a side of a second main surface of the crystal silicon substrate, the second main surface being a surface opposite to the first main surface, wherein the n-type region is formed after the p-type region is formed;
    forming a first passivation film so as to cover the p-type region and the n-type region;
    forming a silicon nitride film as a reflective coat on an entirety of a surface of the first passivation film;
    forming a second passivation film on the second main surface so as to cover the second main surface;
    forming a positive electrode in contact with a surface of the p-type region; and
    forming a negative electrode in contact with a surface of the n-type region, wherein
    each of the first passivation film and the second passivation film is an aluminum oxide film,
    a film thickness of the reflective coat is in a range of 80 to 250 nm,
    a maximum concentration of additive impurity in the p-type region in the substrate depth direction is between $5\times10^{18}$ atoms/cm$^3$ and $5\times10^{20}$ atoms/cm$^3$,
    forming the positive electrode and forming the negative electrode comprises:
        a sub-step of applying Ag paste as conductive paste on the first passivation film or the reflective coat; and
        a sub-step of performing heat treatment on the crystal silicon substrate at a temperature of 700° C. or more and 890° C. or less for 1 second or more and 10 minutes or less, and
    the solar cell is a back surface electrode type solar cell.

2. The method according to claim 1, further comprising: forming an antireflective coat on the second passivation film.

3. The method according to claim 1, wherein a surface of the reflective coat directly contacts the surface of the first passivation film.

4. The method according to claim 1, wherein the reflective coat is entirely formed by a chemical vapor deposition method, a sputtering method, or a vacuum deposition method.

5. The method according to claim 1, wherein a conversion efficiency of the solar cell is equal to or higher than 22.0%.

6. The method according to claim 1, wherein an area occupied by the p-type region is larger than an area occupied by the n-type region on the first main surface.

* * * * *